United States Patent [19]

Jewell et al.

[11] Patent Number: 4,947,413
[45] Date of Patent: Aug. 7, 1990

[54] RESOLUTION DOUBLING LITHOGRAPHY TECHNIQUE

[75] Inventors: Tatiana E. Jewell, Bridgewater; Donald L. White, Springfield, both of N.J.

[73] Assignee: AT&T Bell Laboratories, Murray Hill, N.J.

[21] Appl. No.: 224,522

[22] Filed: Jul. 26, 1988

[51] Int. Cl.$^5$ .............................................. G21K 5/00
[52] U.S. Cl. .................................... 378/34; 378/145; 250/492.2; 250/505.1; 350/311
[58] Field of Search ....................... 378/34, 35, 145, 2; 250/492.2, 505.1; 350/311, 314

[56] References Cited

U.S. PATENT DOCUMENTS

| | | | |
|---|---|---|---|
| 3,492,635 | 1/1970 | Farr | 340/15.5 |
| 3,891,968 | 6/1975 | McMahon | 340/146.3 |
| 4,017,730 | 4/1977 | Barrett | 378/2 |
| 4,075,483 | 2/1978 | Tancrell et al. | 378/2 |
| 4,301,237 | 11/1981 | Burns | 378/35 |
| 4,360,586 | 11/1982 | Flanders et al. | 430/321 |
| 4,377,339 | 3/1983 | Coppock | 355/27 |
| 4,411,013 | 10/1983 | Takasu et al. | 378/35 |
| 4,450,358 | 5/1984 | Reynolds | 250/492.1 |
| 4,458,994 | 7/1984 | Jain et al. | 354/4 |
| 4,498,009 | 2/1985 | Reynolds | 250/452.1 |
| 4,514,858 | 4/1985 | Novak | 378/34 |

OTHER PUBLICATIONS

"Applied Optics and Optical Engineering", by Shannon et al. vol. 10, Academic Press Inc. pp. 180–181.
"Principles of Modern Optical Systems", by Adonovich et al. Artech House pp. 463–469.
"Introduction to Classical and Modern Optics", by Meyers-Arendt, 2d edition, Prentice-Hall, Inc. pp. 427–434.
"Optics", by Hecht et al. Addison-Wesley Publishing Co. Feb. 1979, pp. 332–333, 375–376.
"Spatial Period Division–A New Technique . . . ", D. C. Flanders et al, *J. Vac-Sci-Tech.*, vol. 16, No. 6, Nov./Dec. 1979 pp. 1949–1952.
"Resolution and Linewidth Tolerances . . . ", T. S. Chang et al., *Solid State Technology,* May 1982, pp. 60–65.
"Deep–Ultraviolet Spatial–Period Division . . . ", A. M. Hawryluk et al, *Optics Letters,* vol. 7, No. 9, Sep. 1982, pp. 402–404.
"Deep–UV Spatial–Frequency Doubling . . . ", A. M. Hawryluk et al, *J. Vac. Sci. Tech. B,* vol. 1, No. 4, Oct.–Dec., 1983, pp. 1200–1203.
"Excimer Laser–Based Lithography . . . ", V. Pol et al, pp. 6–16, *SPIE,* vol. 633, Optical Microlithography V, Mar. 13–14, 1986.
"Novel Tunable Pulses Dye Laser . . . ", R. J. Contdini et al., *Electronics Letters,* vol. 22, No. 19, Sep. 11, 1986, pp. 971–973.

Primary Examiner—Janice A. Howell
Assistant Examiner—John C. Freeman
Attorney, Agent, or Firm—Wendy W. Koba

[57] ABSTRACT

A lithography system is disclosed which is capable of doubling the spatial frequency resolution associated with conventional systems. A spatial filter, positioned to intercept the Fraunhofer diffraction pattern of the mask being exposed, is configured to prevent certain orders of the diffraction pattern (in most causes the 0-order and ±2nd, 3rd, . . . orders) from reaching the wafer's surface. The remaining orders reaching the wafer surface (in most cases the ± first-order beams) will produce a cos-type interference pattern with a period half of that if the mask grating were imaged without spatial filtering. Therefore, for a system with a given magnification factor m, a mask grating with a period p will be exposed on the wafer surface as a grating with a period of $p' = pm/2$. Advantageously, the spatial filtering technique of the present invention allows for a variety of different structures (conventional gratings, chirped and phase-shifted gratings, grids, Fresnel zone plates, etc.), as well as structures of different sizes and orientations, to be included on one mask and transferred to the wafer with a single exposure cycle.

21 Claims, 8 Drawing Sheets

RESOLUTION DOUBLING LITHOGRAPHY TECHNIQUE

BACKGROUND OF THE INVENTION

1. Field of the Invention

The present invention relates to a lithography exposure technique and, more particularly, to a technique which utilizes spatial filtering in the Fourier transform plane of the mask to provide twice the resolution of conventional lithography systems.

2. Description of the Prior Art

Various types of integrated optical circuits are beginning to require the formation of sub-micron sized features. For example, distributed feedback lasers include an internal grating layer with a period of 0.23 $\mu$m (feature size 0.115 $\mu$m), and distributed Bragg reflectors on dielectric waveguides often require a period of 0.5 $\mu$m (0.25 $\mu$m feature size).

The ability to provide such fine-line feature resolution has been primarily relegated to two techniques: e-beam direct writing and holographic lithography. E-beam systems, although capable of providing resolution of less than 0.1 $\mu$m, have several drawbacks. First, the process must be performed in a vacuum, requiring that the wafer be placed in a chamber, the chamber evacuated, and the exposure completed. Further, since the electron beam actually "writes" each desired line (or feature), the time required to completely transfer a mask pattern may be quite lengthy. Thus, the throughput time for each wafer becomes excessively long when compared with processes using other exposure techniques, leading to an increase in cost for each wafer produced. Another cost factor is related to the equipment necessary to perform this type of operation. As a result, e-beam direct writing lithography is not considered to be the method of choise for a high volume, industry environment.

The holographic lithography technique mentioned above is also capable of exposing line widths in the 0.25–0.12 $\mu$m range. However, this system is limited in that it can produce only a uniform intensity profile at the wafer surface. That is, holographic techniques can expose only uniform gratings. Thus, this technique is difficult, if not impossible, to employ when it is desired to expose a non-uniform pattern (i.e., chirped or phase-shifted gratings); particularly, the gratings of different periods and shapes placed at different locations on the chip. Additionally, holographic systems, in general, tend to be relatively expensive and are not considered a viable alternative for factory utilization.

In light of the above, much research has been directed toward improving the resolution of photolithography systems for use in the sub-micron regime. One such sub-micron photolithography system is disclosed in U.S. Pat. No. 4,450,358 issued to G. O. Reynolds on May 22, 1984. The Reynolds' system utilizes a deep UV source (excimer laser), coherent condenser optics, a reflective optical system and course/fine focus control, and is capable of exposing line widths in the range of 0.25–0.50 $\mu$m. However, the focus control, as described, requires a significant increase in both the system cost and the time required to perform an exposure.

An alternative sub-micron photolithography technique is disclosed in U.S. Pat. No. 4,360,586 issued to D. C. Flanders et al. on Nov. 23, 1982, and relates to a spatial period division technique. In particular, a mask having a spatial period p is separated from the surface of the wafer by a distance S determined by the relation $S = p^2/n\lambda$. For $n = 2$, the near-field diffraction of a light source through the mask will result in doubling the period of the mask on the wafer surface ($n = 3$ will triple). Therefore, the period of the grating exposed on the wafer will be a function of the gap separating the mask from the wafer. Problems arise, however, in the ability to control this gap so as to provide consistency and uniformity from wafer to wafer for the same mask. For example, with $\lambda = 0.25$ $\mu$m (KrF excimer laser) and $p = 0.5$ $\mu$m, S should be 0.5 $\mu$m, which is difficult to control. For some systems, excessively long exposure times (>190 hours) are also required. A subsequent paper on this same subject, by A. M. Hawryluk et al., entitled "Deep-ultraviolet spatial-period division using an excimer laser", appearing in *Optics Letters*, vol. 7, No. 9, Sept. 1982, pp. 402–4, addresses the long exposure problem. By using an excimer laser source, Hawryluk et al. found that exposure times could be reduced to under one hour (25 minutes, for example). However, the laser-based system still relies on the mask-to-wafer gap control for correct exposure.

Yet another system is described in an article entitled "Excimer laser-based lithography: a deep ultraviolet wafer stepper" by V. Pol et al. appearing in SPIE, Vol. 663, "Optical Microlithography V", Mar. 1986 at pp. 6–16. Here, a deep UV projection system was developed by modifying a commercial step and repeat exposure system to operate at 248 nm with an all-quartz lens and a KrF excimer laser. The quartz lens exhibits a 5× reduction and has a field size of 14.5 mm, with a numerical aperture (NA) which is variable from 0.2 to 0.38. This system has been found to produce a resolution of 0.5 $\mu$m over the 14.5 nm field, with a depth of focus in the range of approximately ±2 $\mu$m. However, the contrast exhibited by this system is too low to provide the printing of gratings with a smaller period, for example, 0.4–0.5 $\mu$m (0.2–0.25 $\mu$m feature size).

Thus, a need remains in the prior art for a lithographic technique which is capable of sub-half-micron resolution, relatively inexpensive and easy to implement, and capable of providing consistent exposures.

SUMMARY OF THE INVENTION

The need remaining in the prior art is addressed by the present invention which relates to an improved projection lithography exposure technique, and more particularly, to such a technique which utilizes spatial filtering in the Fourier transform plane of the mask to provide twice the resolution of conventional lithographic systems.

In accordance with the present invention, an aperture filter is located at the position within the system where the Fourier transform (Fraunhofer diffraction pattern) of the mask will appear (within the projection lens system positioned above the wafer). In one embodiment, the filter is configured to block the zero-order (undiffracted) radiation diffracted by the mask into the lens system. The blocking of the zero-order beam has been found to result in the frequency doubling of the magnified mask grating, by virtue of the interference of the remaining ±first-orders of diffraction on the wafer surface (the filter is configured to also block the higher-order beams—±2nd, 3rd, etc.). This technique thus combines an interference of two beams (±first-order) with the conventional imaging technique as found in prior art projection lithography. In fact, the insertion of such a spatial filter into a standard photolithography system requires only a slight modification, yet results in doubling the resolution of the system. Thus, various photolithographic exposure systems (e.g., Cassagrain-type reflective systems, double-Gauss lens design refractive systems) may utilize this spatial blocking technique.

In another embodiment of the present invention, spatial filtering in the mask Fourier transform plane may be utilized in lithographic systems having oblique illumination, i.e., where the illumination source is off-axis and the spatial filter allows only the 0-order and one first-order beam to interfere. When used with a coherent (or partially coherent source), this filtering and interference technique provides twice the resolution of other coherent systems (with a contrast approaching 100%).

An advantage of the present technique of blocking of the zero-order beam is that it has been found to provide a much higher contrast ($\approx 100\%$) and a much larger depth of focus ($\pm 13$ $\mu$m) than other deep-UV photolithographic systems (typical values: contrast 50%-60%; depth of focus $\approx \pm 1$ $\mu$m). As a result of either using a small illumination source, or small holes in the filter, this system is also less sensitive to lens aberrations than conventional projection lithographic systems.

Another advantage of the spatial filtering technique of the present invention is that gratings with different periods, or gratings with chirp in their period, may be formed at any location on the wafer with only a single exposure. In particular, gratings with different periods, sizes, configurations and orientations can all be produced on the same chip with a single exposure. In fact, this system may be used to print a variety of structures including grids, circles and zone plates. Thus, the present spatial filtering technique finds wide application for the formation of a variety of structures.

Yet another advantage of the present technique is that it is not wavelength-dependent and thus is compatible with virtually any type of illumination source-x-ray, visible, UV, near-UV, deep-UV, etc.

Other and further advantages of the spatial filtering technique will become apparent during the course of the following discussion and by reference to the accompanying drawings.

DETAILED DESCRIPTION

The present invention relates to a type of projection lithography system. In a projection system, an image of the pattern on the mask is projected onto the wafer. The image field is then repeated, or stepped, across the surface of the wafer so as to transfer many copies of the mask pattern onto the wafer surface. In most projection systems, a magnification factor exists between the pattern on the mask and that which is printed on the wafer. That is, a mask pattern with 25 $\mu$m sized features, when used with a 10× reduction system (magnification factor m=0.1) will be capable of printing 2.5 $\mu$m features on the wafer surface.

Figure 1:
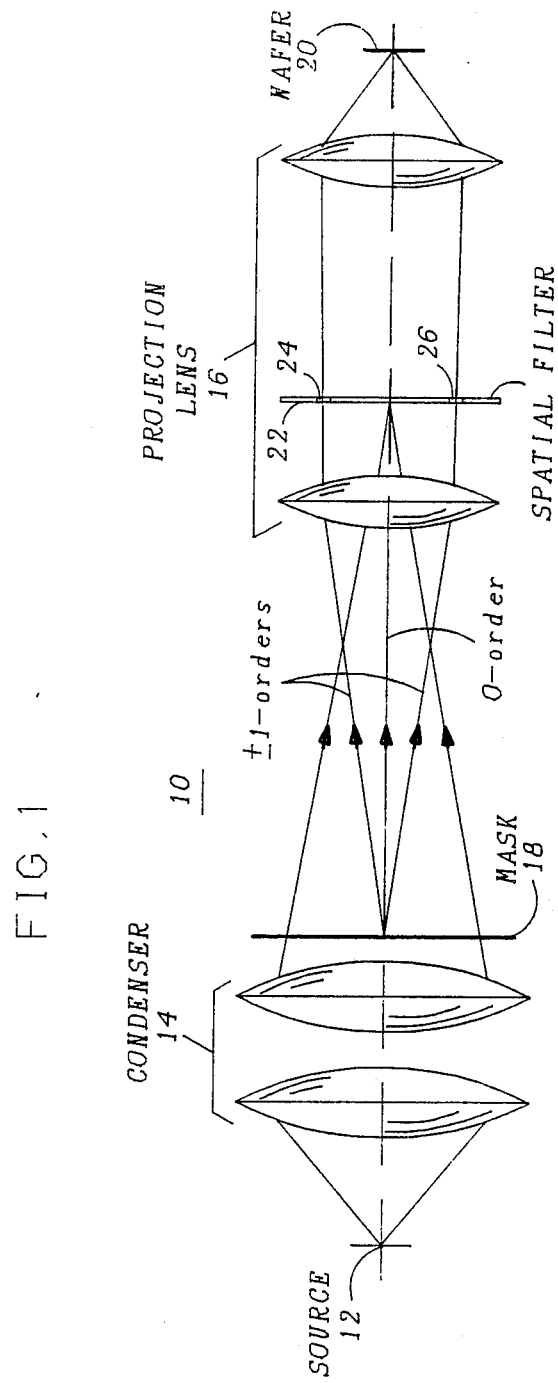
FIG. 1 illustrates, in a diagram form, an exemplary lithographic system of the present invention.

FIG. 1 illustrates, in a simplified diagrammatic form, the optics of an exemplary projection system 10 utilizing the spatial filtering technique of the present invention. It will be assumed, for the purposes of the present discussion, that a coherent source 12 is used; that is, a point source will be illuminating the mask. (However, the system of the present invention may also utilize a incoherent source, or alternatively, a partially coherent source.) The light output from source 12 subsequently passes through a condenser 14, where condenser 14 is an imaging system which forms an image of source 12 at lens entrance pupil 15. A mask 18 is positioned at the exit pupil of condenser 14 and is illuminated by the light beam emerging from condenser 14.

Figure 2:
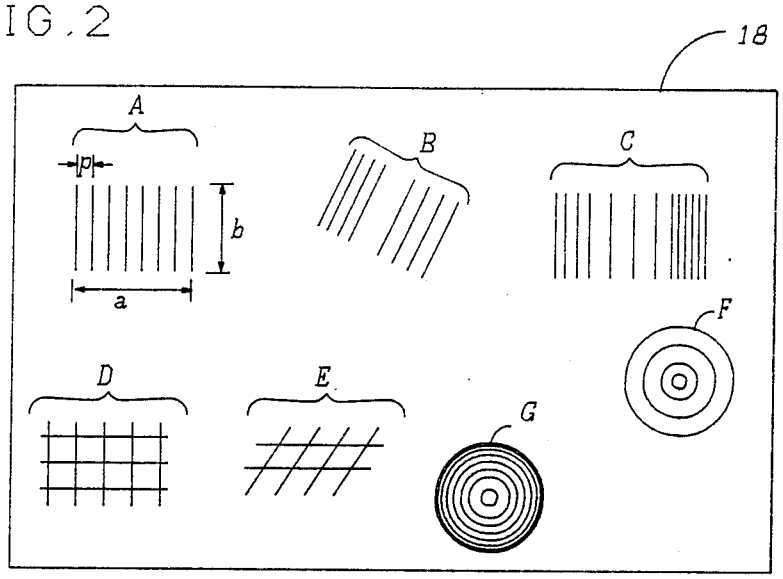
FIG. 2 illustrates an exemplary mask, including a variety of grating structures, grids, circles and zone plates which may all be exposed with the spatial filtering system of the present invention.

Mask 18 may contain various patterns (series of lines and spaces) which are desired to be produced on the surface of the wafer. One such exemplary mask is illustrated in FIG. 2. This particular mask contains three different grating patterns which are to be exposed, the first pattern A being a simple grating with a duty cycle of ½ (equal lines and spaces). A phase-shifted pattern B (a grating with an extended gap between adjacent lines to provide a desired phase shift) and a chirped pattern C (a plurality of gratings with different periods, juxtaposed to form a single grating structure) are also included in mask 18. As noted above, an advantage of the spatial filtering projection system of the present invention is that these various types of gratings may all be formed with a single exposure.

In fact, as noted above, the spatial filtering technique of the present invention can be utilized to provide resolution doubling of structures other than gratings, most notably, two-dimensional structures. For example, grids (which may be thought of as two intersecting gratings) may also be printed. Two examples of such grids are illustrated in FIG. 2, the first pattern D being a rectangular grid, and a second pattern E being an oblique grid. When two-dimensional masks are used, the spatial filter must be configured to pass the first-order beams associated with each dimension. The light will be diffracted by such a grid to form a two-dimensional set of spots on the wafer surface. If a pair of half-wave plates are added to the mask in this case (to retard one set of first-order beams with respect to the other set), an increase in resolution may be obtained, at the expense of decreased contrast.

Additionally, a set of N evenly-spaced circles on the mask, illustrated as pattern F, will be printed as a set of 2N evenly-spaced circles on the wafer, the factor 2 attributed the frequency doubling of the spatial filter. A Fresnel zone plate, illustrated as pattern G in FIG. 2, is similar to the circular pattern described above, but has a varying space between adjacent circles. Normally, a zone plate cannot focus light to a spot any smaller than its outermost ring. Thus, a zone plate formed by a conventional prior art lithographic process cannot exhibit any better resolution than the lithographic process itself. However, when such a zone plate is printed using the spatial filtering technique of the present invention (i.e., allowing only the ±first-order beams to pass through the filter and interfere at the wafer surface), the frequency of the lines will double and the image will be a zone plate with half the focal length of a conventionally imaged zone plate. When a zone plate printed by this method is used as a lens for printing small patterns or focusing light to a point, its resolution would be doubled. Thus, even though the lens with a spatial filter cannot focus light to a point twice as fine as when the lens is used in its conventional form, it can be used to make zone plates capable of such performance. Depending on the degree of coherence in the light source and the size of central obscuration, the central zone and perhaps the first few zones may not be printed accurately. However, this will not affect the resolution of the zone plate when it acts as a lens.

Returning to FIG. 1, optical lithography system 10 further includes a projection lens 16 arrangement which is utilized, as described above, to image the mask pattern onto the surface of a wafer 20. Projection lens 16 also provides the desired magnification, m, between mask 18 and wafer 20. Typical projection systems provide either a 5× or 10× reduction. For the purposes of the present discussion, a 5× system (magnification factor m=0.2) will be assumed. Most importantly, projection system 10 of the present invention includes a spatial filter 22 which is positioned within projection lens 16 at the location where the Fraunhofer diffraction pattern (Fourier transform) of mask 18 will appear. As will be described in more detail below, spatial filter 22 is designed to block the 0-order (undifracted) beam of the Fraunhofer diffraction pattern from reaching the surface of wafer 20, as well as the higher-order (2nd, 3rd, etc.) beams, the latter beams (when small period gratings are printed) being blocked as in conventional projection lithography systems.

Figure 3:
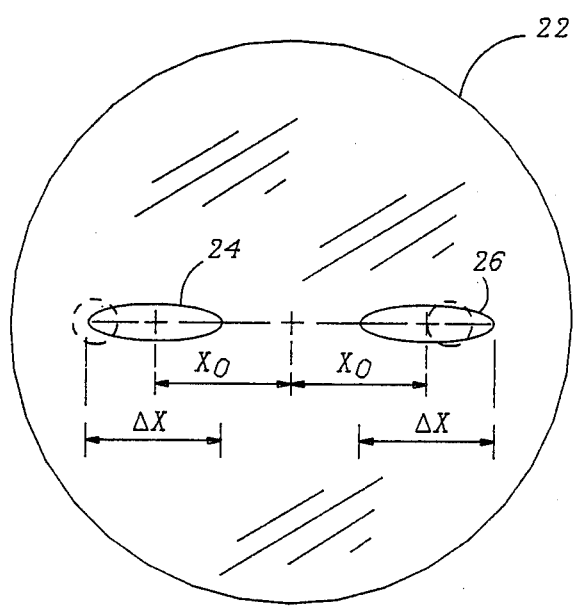
FIGS. 3-5 illustrate various spatial filters which may be included in the system of FIG. 1.

FIG. 3 illustrates one such exemplary spatial filter 22 which includes a pair of apertures 24,26, disposed as indicated in the drawing. With the blocking of the 0-order beam by filter 22, the illumination reaching the surface of wafer 20 will not be an image of the mask grating, but in reality the cosine-type interference fringes produced by the interfering first-order beams which are allowed to pass through apertures 24,26 of filter 22. The result of this interference is that the period of the filtered illumination will be twice as small as the period of the grating would be if imaged through a conventional lensing system. Therefore, a mask grating with a period of 5.0 μm will produce a grating with period 0.5 μm on the wafer surface. The resolution of the inventive projection system is thus doubled, when compared with conventional systems, by blocking the 0-order beam from the wafer surface.

Figure 4:
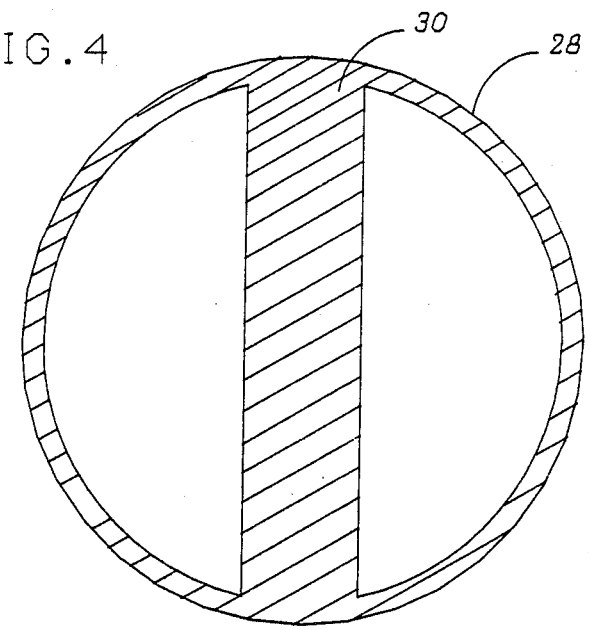
Figure 5:
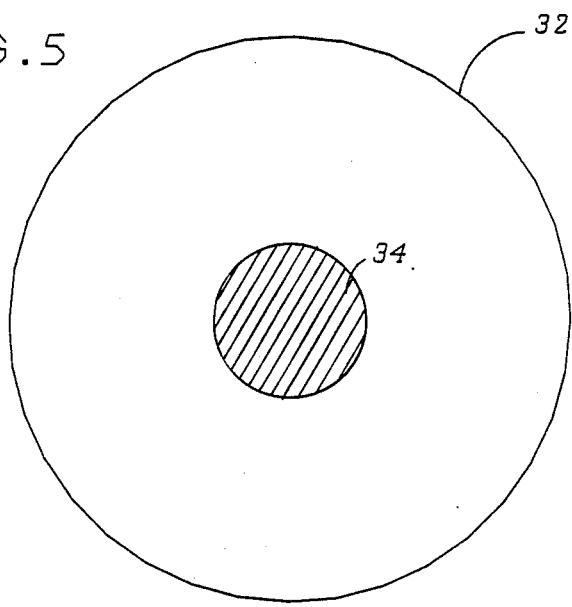

FIG. 4 illustrates an alternative blocking filter 28 which includes a vertical stripe 30 for blocking the 0-order beam. Another filter design which also allows the higher orders to be passed is illustrated in FIG. 5. As shown, filter 32 of FIG. 5 includes a central obstruction 34 which is designed to block only the 0-order beam. This filter will allow to pass two first orders diffracted by object gratings oriented in any direction on the mask (45°, vertical, horizontal, etc.). The arrangements of FIGS. 4 and 5 are considered to be less sensitive to system misalignment than the arrangement of FIG. 3, since the diffraction pattern may be significantly offset from the masks in either the horizontal or vertical directions, and the first-order beams will still pass through and interfere at the wafer's surface. In contrast, a slight misalignment of filter 22 (as shown in phantom in FIG. 3) will result in a portion of at least one of the first-order beams being blocked. It is to be understood, however, that the arrangement of FIG. 3 has the advatage of reducing the amount of stray (background) light reaching the wafer surface, thus providing a higher contrast image when compared to the filter designs of FIGS. 4 and 5. In addition, it may filter out many mask imperfections, such as scratches and dust particles.

The following description will provide a detailed analysis of the exposure of the exemplary grating structure A depicted in FIG. 2. This particular grating structure was chosen merely to simplify the mathematics which are presented below. It is to be understood that the 0-order blocking technique may be used to expose virtually any grating pattern.

Figure 6:
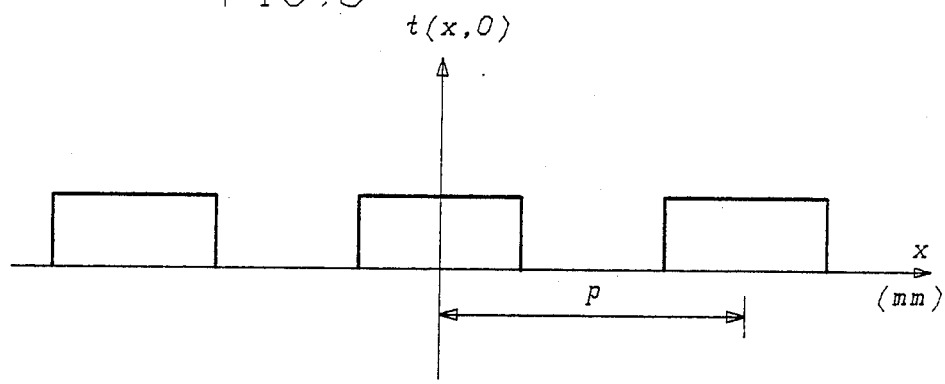
FIG. 6 represents the spatial function describing one exemplary grating structure of FIG. 2.

A typical grating pattern A can be described by the relation:

$$t(x,y) = \left[ \text{rect}\left(\frac{2x}{p}\right) * \left(\frac{1}{p}\right) \text{comb}\left(\frac{x}{p}\right) \right] \text{rect}\left(\frac{x}{a}, \frac{y}{b}\right), \quad (1)$$

where p is the period of the grating, a and b the grating dimensions in the x and y directions, respectively (p, a and b are illustrated in FIG. 2), $$\text{rect}\left(\frac{2x}{p}\right)$$

is a zero-one function of width p/2, $$\text{comb}(x) = \sum_{n=-\infty}^{\infty} \delta(x - n),$$

δ(x) is Dirac δ function and * denotes a convolution operation. FIG. 6 illustrates this particular function. The Fraunhofer diffraction pattern (spectrum) of an illuminated object is its Fourier transform. Thus, in accordance with the present invention, the spatial filtering is performed at the aperture plane of the lens system, which is placed in the frequency plane of the object, i.e. the plane where Fraunhofer diffraction pattern of the object is displaced. For grating pattern A, the Fourier transform is given by the following:

$$T(\xi,\eta) = \left[\frac{p}{2} \text{sinc}\left(\frac{p}{2}\xi\right) \text{comb}(p\xi)\delta(\eta)\right] ** (ab)\text{sinc}(a\xi,b\eta), \quad (2)$$

where ξ and η are the spatial frequencies of the grating in the x and y directions, respectively, and sinc $$\xi = \frac{\sin \pi \xi}{\pi \xi}.$$

The term ** denotes a two-dimensional convolution function.

As discussed above, projection lens system 16 of the present invention will produce an image which is magnified by the factor m. The spectrum of this geometrical image is then given by:

$$T(\xi,\eta) = \tag{3}$$

$$\frac{1}{2m} \left[ \operatorname{sinc}\left(\frac{mp\xi}{2}\right)(mp)\operatorname{comb}(mp\xi) \right] * (m^2 ab)\operatorname{sinc}(ma\xi, mb\eta).$$

Figure 7:
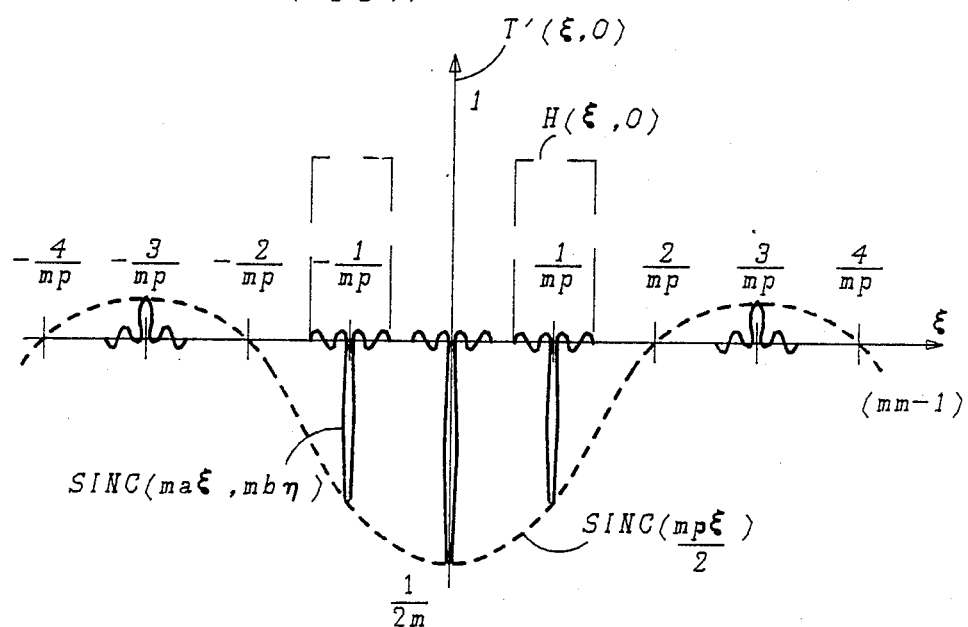
FIG. 7 represents the spectrum of the geometrical image of the spatial function of FIG. 6, with an exemplary spatial filter formed in accordance with the present invention also illustrated in FIG. 7.
Figure 8:
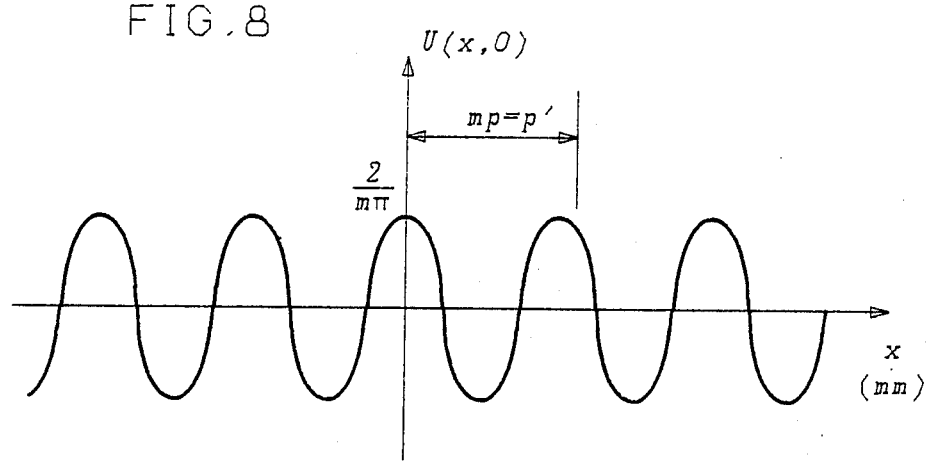
FIG. 8 represents the amplitude distribution of the electric field, in the image plane, of the exemplary grating structure.

The spectrum of the geometrical image, as illustrated in FIG. 7, consists of an array of very narrow sinc-functions (the width of a main lobe being 2/ma and 2/mb in the ξ and η directions, respectively), spaced at intervals of 1/mp in frequency space and weighted by a broad sinc-function envelope of $$\operatorname{sinc}\left(\frac{mp\xi}{2}\right).$$

The sinc function at ξ=0 corresponds to the 0-order (undiffracted) light. The sinc functions at $$\xi = \pm \frac{1}{mp}$$

correspond to the ±first-orders. As stated above, this particular grating pattern has a duty cycle of ½ (equal lines and spaces). Therefore, the value of the envelope sinc function at $$\xi = \pm \frac{1}{mp}$$

is 2/π, and the non-zero even diffraction orders are missing. Various other grating patterns with duty cycles other than ½ will result in a similar geometric spectrum, in terms of the array of narrow sinc functions. However, the envelope sinc function will vary with respect to the particular duty cycle.

Referring back to FIG. 1, the light signal passing through the entrance pupil of projection lens 16 will subsequently impinge spatial filter 22. The exemplary 0-order spatial filter 22 illustrated in FIG. 3 can be described in the frequency domain by the relation:

$$H(\xi,\eta) = \tag{4}$$

$$\operatorname{cyl}\left\{\frac{[(\xi - \xi_o)^2 + \eta^2]^{\frac{1}{2}}}{\Delta \xi}\right\} + \operatorname{cyl}\left\{\frac{[(\xi + \xi_o)^2 + \eta^2]^{\frac{1}{2}}}{\Delta \xi}\right\},$$

which will transmit only a range of spatial frequencies Δξ wide, centered at ξ_o, while blocking all other frequencies of the spectrum. In equation (4), the cyl (cylinder) function is a zero-one function of Δξ diameter. This function is illustrated in FIG. 7 for $$\xi_o = \frac{1}{mp}$$

It is to be noted that Δξ must be large enough to transmit a main lobe and a few side lobes of the sinc function. Referring back to FIG. 3, the following relationships between the spatial frequency and aperture dimensions are used to determine the actual dimensions of apertures 24 and 26:

$$\xi = \frac{m_p x}{\lambda z}, \text{ and}$$

$$\eta = \frac{m_p y}{\lambda z}$$

where $m_p$ is the exit pupil magnification of projection lens 16 (the ratio of the exit pupil diameter to the aperture diameter), and z is the distance between the exit pupil and wafer 20. Therefore, an exemplary spatial filter 22 may be opaque, with apertures 24,26 of diameter $$\Delta x = \frac{2\lambda z}{m_p} \Delta \xi,$$

placed at a distance $$x_o = \frac{\lambda z}{m_p} \xi_o$$

from the center of the filter.

The spectrum of the diffracted image after it passes through the filter may thus be obtained by multiplying equations (3) and (4) together:

$$U(\xi,\eta) \approx T(\xi,\eta)H(\xi,\eta) = \tag{5}$$

$$\frac{1}{m\pi}\left[\delta\left(\xi + \frac{1}{m_p}\right) + \delta\left(\xi - \frac{1}{m_p}\right)\right] * (m^2 ab)\operatorname{sinc}(ma\xi, mb\eta),$$

where sinc $$\left[\frac{1}{2}\right] = \frac{2}{\pi}$$

has been used. The complex amplitude of the image may then be obtained by performing an inverse Fourier transform on equation (5):

$$u(x,y) = \left(\frac{2}{m\pi}\right)\cos\left(\frac{2\pi x}{mp}\right)\operatorname{rect}\left(\frac{x}{ma}, \frac{y}{mb}\right), \tag{6}$$

the approximation related to the assumption that the sinc-function components of the spectrum are so narrow, relative to the width of filter H(ξ, η), tha they will either be passed or completely eliminated. Since the 0-order term (as well as higher orders: 2nd, 3rd, etc.) has been blocked by filter 22, the image amplitude varies as a cosine function with a period p' equal to the period p of the grating multiplied by the magnification factor m of the system.

Figure 9:
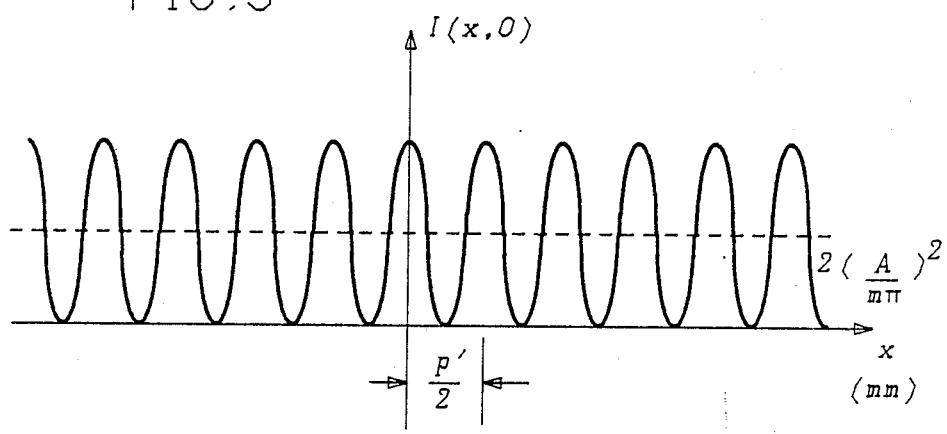
FIG. 9 represents the final image irradiance of the frequency-doubled grating structure which impinges the surface of the resist on the wafer.

Lastly, the irradiance at the image plane is given by:

$$I = |Au(x,y)|^2 \quad (7)$$

$$\approx \left(\frac{2A}{m\pi}\right)^2 \cos^2\left(\frac{2\pi x}{mp}\right) \text{rect}\left(\frac{x}{ma}, \frac{y}{mb}\right)$$

$$= 2\left[\frac{A}{m\pi}\right]^2 \left(1 + \cos\frac{2\pi x}{mp/2}\right) \text{rect}\left(\frac{x}{ma}, \frac{y}{mb}\right),$$

where A is the coefficient which depends on the magnitude of the illuminating wave field and the losses in the optical system. The image irradiance is illustrated in FIG. 9. Since the irradiance is a squared function of the amplitude, it will also be a cosine function, with a period half that of the amplitude distribution. That is, if the desired grating period in the image is p', the period on the mask grating should be p=2p'/m. Therefore, to produce a 0.50 μm period grating structure, in a 5× system (m=0.2), the period on the mask will be p=2(0.50 μm)/2=5.0 μm. In contrast, a conventional projection system with the same mask period p and magnification m would have an irradiance described by the function:

$$I(x,y) \approx \left[\frac{A}{2m\pi}\right]^2 (\pi^2 + 8)\left[1 + \frac{8\pi}{(\pi^2 + 8)}\cos\frac{2\pi x}{mp} + \frac{8}{(\pi^2 + 8)}\cos\frac{4\pi x}{mp}\right]\text{rect}\left[\frac{x}{ma}, \frac{y}{mb}\right] \quad (8)$$

and would therefore only be able to print a grating with period pm=1.0 μm.

Since the 0-order portion of the diffracted image is removed, the total irradiance (power) of the remaining signal reaching the wafer surface will be less than that associated with the conventional unfiltered projection arrangement. In particular, the filtered image irradiance will be $8/(\pi^2+8)=0.45$, or 45% of the irradiance of the unfiltered image. This power level may be increased by using a mask that is a phase grating, in which the pattern is formed as a change in the phase of the transmitted light, instead of change in the amplitude transmission. That is, the lines and spaces on the mask would both be transparent, but would introduce different phase shifts in the transmitted light. Assuming a small numerical aperture illuminating beam and the phase retardation between the light passing through lines and spaces of the mask being one half of the illuminating wavelength, there would be almost no 0-order light. The gratings with twice the normal frequency will be formed at power levels higher than with an ordinary amplitude transmission mask. Since the 0-order beam may be not completely cancelled, it is preferable to use the 0-order blocking spatial filter in the system.

Figure 10:
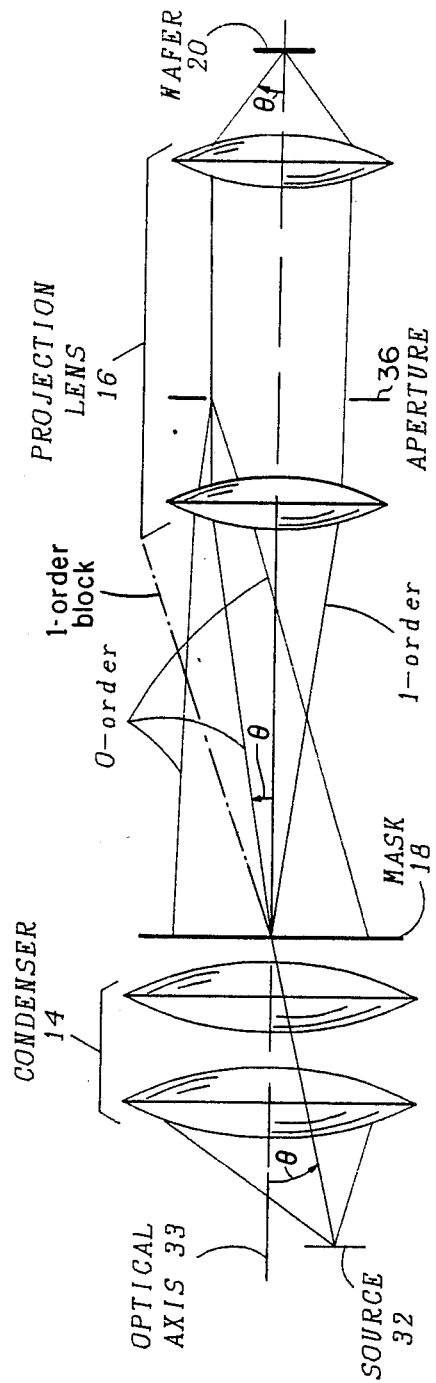
FIG. 10 illustrates an alternative, obliquely illuminated, lithography system, utilizing the spatial filtering technique of the present invention.
Figure 11:
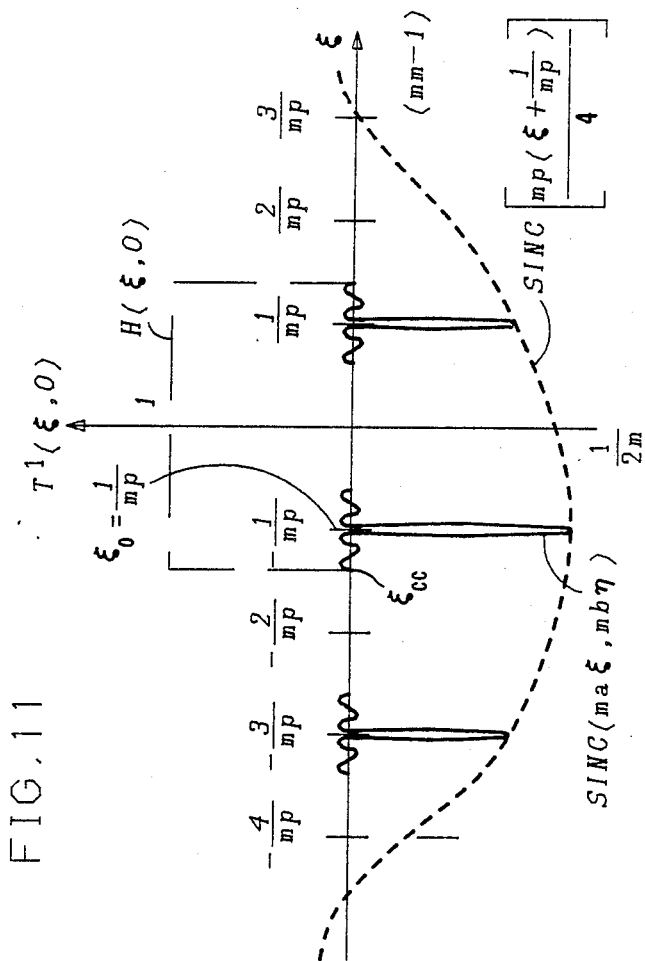
FIG. 11 is representative of the spectrum of the geometrical image obtained from the oblique illumination system of FIG. 10.

High frequency gratings can also be imaged by using an oblique illumination, as illustrated in FIG. 10. In this system, the incoming illumination beam makes an angle θ with the optical axis, and the 0-order is not blocked in the Fourier transform plane-however, one of the two first orders is blocked by the edge of the aperture in the projection lens. If a coherent input beam was tilted at an angle in the x-direction corresponding to an angle θ, the spectrum of the geometrical image would remain the same as for the on-axis illumination case, except for a shift in the envelope sinc function by the amount $\xi_o=1/mp$ as shown in the spectrum of the geometrical image, illustrated in FIG. 11. If the grating frequency $\xi_g$ is greater than $\xi_{cc}-\xi_o$ ($\xi_{cc}$ being the coherent cutoff frequency of the system), one first-order beam will be stopped by the lens aperture, i.e., the beam at the angle which corresponds to the frequency ($\xi_g+\xi_o$) will be too large to pass through the lens.

Referring back to FIG. 10, projection system 30 utilizes a point source 32 which is located at an angle θ from the optical axis 33 of the system. Similar to the arrangement of FIG. 1, projection system 30 utilizes condenser lens 14, projection lens 16 and an exemplary mask 18, where it is desired to transfer the pattern appearing on mask 18 to wafer 20. A normal projection lens aperture 28 is then utilized to permit the passage of the 0-order and a first-order beams through the system.

In order to obtain features of the same period p' in the image plane, the period of the mask grating should be p/2, so that the distance between the two interfering orders (the zero-order and a first-order) in the frequency domain will remain the same (2/mp) values as above for the on-axis illumination case of the interfering +,−first-order beams. The distance between the two interfering orders then corresponds to a certain angle between the two interfereing beams at the surface of wafer 20, and is given by the relation:

$$\Delta\xi = \frac{2NA'}{x} = \frac{1}{p'},$$

where NA'=sin θ' and θ' is the half angle, as illustrated in FIG. 10, between the interfering beams at the wafer surface.

It is to be noted that in the case of oblique illumination the grating frequency is not doubled. That is, the mask frequency will be faithfully reproduced. The image irradiance is $(\pi^2+4)/(\pi^2+8)=0.78$, or 78% of the value associated with a conventional coherent image, for a grating of frequency less than $\xi_{cc}$. This power level represents a significant increase over the 45% value associated with the on-axis case frequency doubling described above. However, the contrast associated with oblique illumination will be approximately 91%, slightly below the 100% contrast of the on-axis frequency doubling case.

A major advantage of utilizing oblique illumination to form high frequency gratings is that large features (several microns, for example), including zero frequency patterns, may be printed, although their image may be somewhat distorted. The disadvantages are that only high frequency gratings approximately in the direction of the oblique illumination may be printed, and it may be difficult to provide such oblique illumination in a conventional camera system.

In summary, the on-axis frequency doubling spatial filtering technique would be utilized in situations where there are gratings oriented in several directions, or where the mask contains only grating structures. Oblique illumination may be the preferred alternative when it is desirable to print coarse features as well as gratings, as long as the gratings are all oriented in approximately the same direction.

If the mask contains gratings of the same period, but with duty cycles other than one-half (i.e., unequal size of lines and spaces), their images will look exactly the same as the images of gratings with equal lines and spaces. The difference in duty cycle will only affect the width of the envelope sinc function in the image spectrum, which results in change of the percentage of the light diffracted into two first orders.

It is possible to produce the grating with duty cycles different than one-half by overexposing or underexposing the resist film which will result in different line width in the grating after the development and etching process.

EXAMPLE

Gratings with a period of 0.5 μm were fabricated using the spatial frequency doubling system of the present invention. The system used a KrF excimer laser, operating at 248.4 nm as its illumination source. A 5× reduction (0.2 magnification factor) fused silica lens with a numerical aperture of 0.38 and a 14.5 mm diameter field was used as the projection system. The mask contained 2.5 mm×1.25 mm gratings of 5 μm period uniformly distributed across the mask's field. The spatial filtering was accomplished by placing a filter with two openings (6.2 mm×3.1 mm, spaced 30.1 mm apart) into the projection lens.

Figure 12:
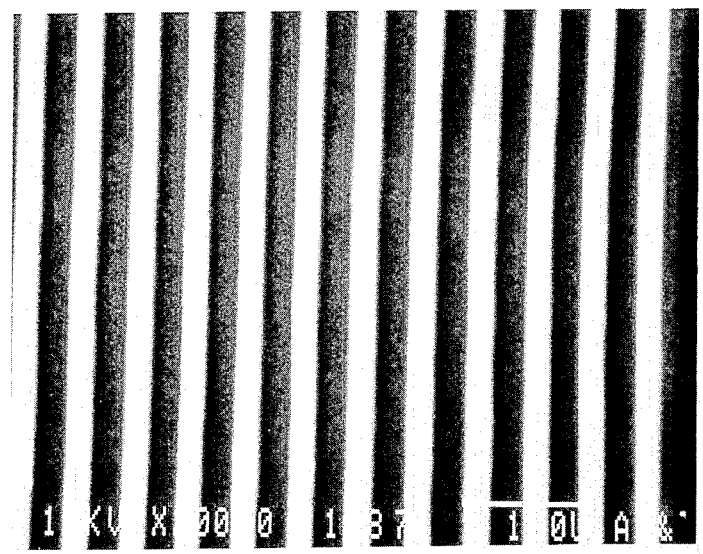
FIG. 12 is an SEM photograph of an exemplary grating with a period of 0.5 $\mu$m (0.25 $\mu$m feature size) formed using the spatial blocking technique of the present invention.

The wafers to be exposed included a 10 μm thick oxide top surface layer upon which a conventional deep UV tri-level photoresist was deposited. FIG. 12 is an SEM photograph of the pattern transferred into the photoresist. As shown, well-defined gratings with a period of 0.5 μm were formed. The wafer period of 0.5 μm being a result of the mask period multiplied by the magnification factor, then divided by 2, the division the result of the frequency doubling technique of the present invention.

In accordance with the teachings of the present invention, therefore, it is possible to double the resolution of a standard projection system by inserting a 0-order blocking filter at the position within the projection system where the Fraunhofer diffraction pattern (Fourier transform) of the mask appears.

We claim:

1. A lithography system for exposing patterns consisting of regular lines and spaces on a wafer surface, the system comprising
   an illumination source;
   a mask containing at least one pattern with a predetermined period p which is illuminated by said illumination source, a Fraunhofer diffraction pattern including a 0-order, ±first order and a plurality of higher-order beams being created by the illumination passing through the at least one pattern, and
   an imaging system with a predetermined magnification factor m disposed between the mask and the wafer for creating the Fourier transform of said illuminated mask and directing the illumination towards the wafer surface, characterized in that the imaging system includes a spatial filter positioned at the Fourier transform plane of said imaging system, said spatial filter including a central obscuration capable of providing resolution doubling on the wafer surface of said predetermined mask period.

2. A lithography system as defined in claim 1 wherein the illumination source is chosen from the group consisting of a coherent illumination source and a partially coherent illumination source, such that the central obscuration of the spatial filter completely intercepts the 0-order beam of the Fraunhofer diffraction pattern, wherein the at least one pattern exposed on the wafer surface comprises a period $p' = pm/2$.

3. A lithography system as defined in claim 2 wherein the illumination source is the coherent source.

4. A lithography system as defined in claim 3 wherein the illumination source is chosen from the group consisting of excimer laser sources, x-ray sources, visible sources, UV sources, near-UV sources, and deep-UV sources.

5. A lithography system as defined in claim 2 wherein the illumination source is the partially coherent source.

6. A lithography system as defined in claim 2 where the at least one pattern contained in the mask is chosen from the group consisting of grating patterns, grid patterns, Fresnel zone plates, and concentric circular patterns.

7. A lithography system as defined in claim 6 wherein the grating patterns include a plurality of gratings of different periods, phase-shifted gratings, and chirped gratings.

8. A lithographic system defined in claim 6 wherein the mask is transparent and the pattern on the mask consists of regions that produce different phase delay in the light passing through the regions.

9. A lithography system as defined in claim 2 wherein the spatial filter is essentially opaque, with a pair of apertures which are capable of passing only the ±first-orders of the Fraunhofer diffraction pattern.

10. A lithography system as defined in claim 2 wherein the spatial filter is essentially transparent, with a vertical opaque stripe of a predetermined width sufficient to intercept the 0-order beam of the Fraunhofer diffraction pattern.

11. A lithography system as defined in claim 1 wherein the illumination source is chosen from the group consisting of a coherent illumination source and a partially coherent illumination source, the illumination source positioned at an oblique angle relative to the optical axis of the lithography system, and the mask containing gratings oriented with the oblique illumination source, the patterns comprising a spatial frequency greater than the coherent cutoff frequency ($\xi_{cc}$) of the lithography system.

12. A lithography system as defined by claim 10 wherein the mask contains both features on the order of and grating patterns.

13. In a projection lithography system, a method of increasing the system resolution, the method comprising the steps of:
   (a) providing a mask containing a series of lines and spaces, defined as at least one pattern with a predetermined period p, to be formed on a wafer surface;
   (b) illuminating the mask provided in step (a), the illumination forming a Fraunhofer diffraction pattern consisting of a 0-order, ±first-order and a plurality of higher-order beams;
   (c) imaging the Fraunhofer diffraction pattern of step (b) at a Fourier transform plane and forming the Fourier transform thereof; and
   (d) filtering the image of the Fraunhofer diffraction pattern formed in the Fourier transform plane so as to remove a central portion of the Fraunhofer diffraction pattern so as to provide resolution doubling on said wafer surface of said predetermined mask period.

14. The method of claim 13 wherein in performing step (d), the filtering removes the 0-order beam of the Fraunhofer diffraction pattern.

15. The method of claim 13 wherein in performing step (d), the filtering removes the 0-order and the plurality of higher-order beams of the Fraunhofer diffraction pattern.

16. The method of claim 13 wherein in performing step (a), the mask contains a plurality of different patterns chosen from the group consisting of grating structures, grid structures, concentric circle structures, and Fresnel zone plate structures.

17. The method of claim 16 wherein the grating structures comprises gratings of different periods, phase-shifted gratings, and chirped gratings.

18. The method of claim 13 wherein in performing step (b), the illumination is chosen from the group consisting of coherent illumination and partially coherent illumination.

19. The method of claim 18 wherein the coherent illumination is chosen from the group consisting of x-ray, visible, UV, near-UV and deep-UV.

20. The method of claim 17 wherein in performing step (b), an illumination source for providing the illumination is located along the optical axis of the lithography system and in performing step (d), the filtering removes the 0-order beam of the Fraunhofer diffraction pattern, wherein the removal of the 0-order beam results in doubling the resolution of the lithography system.

21. The method of claim 17 wherein in performing step (b), an illumination source for providing the illumination is positioned at an oblique angle relative to an optical axis of the lithography system, in performing step (a), the mask contains patterns with a spatial frequency greater than the coherent cutoff frequency of the lithography system, the at least one pattern oriented to be aligned with the oblique illumination source, and in performing step (d), the filtering allows the 0-order and a first-order beam to pass through and interfere at the wafer surface.

* * * * *